United States Patent [19]
Anami

[11] Patent Number: 5,001,363
[45] Date of Patent: Mar. 19, 1991

[54] CIRCUIT FOR MEASURING ROTARY SHAFT OFF-SETS
[75] Inventor: Yosinori Anami, Hyogo, Japan
[73] Assignee: Mitsubishi Denki Kabushiki Kaisha, Tokyo, Japan
[21] Appl. No.: 409,784
[22] Filed: Sep. 20, 1989
[51] Int. Cl.⁵ .................. H03K 5/159; G01P 3/42; G01P 3/48; G01B 7/14
[52] U.S. Cl. .................. 307/353; 324/160; 324/166; 324/207.12; 324/207.25; 328/151
[58] Field of Search .................. 307/358, 352, 353; 324/160, 166, 207.12, 207.25; 328/151

[56] References Cited
U.S. PATENT DOCUMENTS
4,282,515  8/1981  Patterson, III .............. 340/347 CC
4,625,322  11/1986  Tokazaki et al. .............. 377/58
4,634,895  1/1987  Luong .............. 307/350

FOREIGN PATENT DOCUMENTS
2837669  3/1979  Fed. Rep. of Germany .
56-48802  11/1981  Japan .

Primary Examiner—Stanley D. Miller
Assistant Examiner—N. T. Nguyen
Attorney, Agent, or Firm—Rothwell, Figg, Ernst & Kurz

[57] ABSTRACT

Disclosed herein is a circuit for measuring off-sets of a rotary shaft. In the circuit, a difference in time is produced, by a given sampling time, between an off-set output signal to be inputted to a low-level output selector and another off-set output signal to be inputted thereto. Owing to the above time difference, even though each off-set output signal undergoes a stepwise variation due to each DC off-set, the variation occur in each off-set output signal at the time difference. It is therefore possible to select either one of the off-set output signals, namely, the low-level off-set output signal, whereby the off-set output signal can be produced as an output free of a voltage level indicative of a rise in the off-sets due to an external disturbance corresponding to the variation.

4 Claims, 5 Drawing Sheets

CIRCUIT FOR MEASURING ROTARY SHAFT OFF-SETS

BACKGROUND OF THE INVENTION

1. Field of the Invention

This invention relates to a circuit for measuring off-sets of a rotary shaft for use in a turbine generator and the like.

2. Description of the Prior Art

FIG. 1 shows an off-set measuring circuit which has been disclosed in, for example, Japanese Patent Publication Laid-Open No. 48802/1981. The off-set measuring circuit is composed of a peak-to-peak amplitude detector 1, reset pulse generators $8_a$ and $8_b$ each of which detects a projection 7 on a rotary shaft 6 to generate a train of reset signal pulses $V_{r1}$ and another train of reset signal pulses $V_{r2}$ which are in synchronism with the rotary period of the rotary shaft 6, a third peak-value holding circuit 5 for holding the peak value of each off-set signal $V_1$ from a second peak-value holding circuit 4 and a signal selector 9 composed of diodes 10 and 11 adapted to select either one of the off-set signal $v_1$ and an off-set signal $V_2$ outputted from the third peak-value holding circuit 5 and a resistor 12, namely, the high level signal. The first and second peak-value holding circuits 2 and 4 are reset by the reset signal pulses $V_{r1}$ in a state that the third peak-value holding circuit 5 has held each off-set signal in a given measuring period. In addition, the third peak-value holding circuit 5 is reset in a state that the second peak-value holding circuit 4 has held each off-set signal in the next measuring period.

FIGS. 2(a) through 2(f) are waveform charts of signals at individual devices and describe the operation of the off-set measuring circuit shown in FIG. 1. An alternating-current input signal $V_{in}$ to be inputted to the peak-to-peak amplitude detector 1 is shown in FIG. 2(a). Each of such reset signal pulses $V_{r1}$ and $V_{r2}$ as illustrated in FIGS. 2(b) and 2(c) is produced in synchronism with the rotary period of the rotary shaft. First of all, the peak-value holding circuit 5, which is holding the peak value of the signal $V_1$, is reset by the reset signal pulses $V_{r2}$, as shown in FIG. 2(e). After the peak-value holding circuit 5 has held the peak value of the signal $V_1$ again, the first and second peak-value holding circuits 2 and 4 are reset by the reset signal pulses $V_{r1}$ as illustrated in FIG. 2(d). When each output $V_2$ is produced from the peak-value holding circuit 5 in which the signal $V_1$ in the previous period has been held, the peak-to-peak amplitude detector 1 produces an off-set signal $V_1$ in the next period. The signal selector 9 selects either one of the signals $v_1$ and $V_2$, namely, the signal $V_2$ of a high level for outputting an output $V_{out}$ as shown in FIG. 2(f). The same operation is repeated whenever the peak-to-peak amplitude of the input signal $V_{in}$ is reduced. As a result, following the reductions in the amplitude of the input signal, the amplitude of the output $V_{out}$ is also reduced with a delay corresponding exactly to one period. Thus, the output signal $V_{out}$ has such an overall waveform as shown in FIG. 2(f).

Conventional off-set measuring circuits have been constructed as described above. Therefore, when the distance between a sensor for detecting off-sets and an object to be measured (for example, a rotary shaft of a turbine generator) varies stepwise due to thermal expansion of a turbine upon measurement of off-sets of the rotary shaft, the off-set value $V_A$ as a DC component of the off-set input signal $V_{in}$ also varies stepwise as shown in FIG. 3(a). In addition, as the off-set value $-V_A$ changes, a high-level portion appears in the off-set output $V_{out}$ for a time interval corresponding to the interval between each two consecutive measurements of the off-set of the rotary shaft, namely, one period in spite of the fact that the off-set remains constant as clearly illustrated in FIG. 3(f). As a consequence, the prior art circuits are accompanied by the problem that off-sets cannot be measured accurately.

SUMMARY OF THE INVENTION

The present invention has been completed with the foregoing problem in view. The present invention has as its principal object the provision of a circuit for measuring off-sets of a rotary shaft, which is capable of cancelling DC off-set variations, which are contained in an off-set input signal from an off-set output signal so as to eliminate a voltage level indicative of a rise in the off-sets due to an external disturbance corresponding to the variations.

In one aspect of this invention, there is thus provided a circuit for measuring off-sets of a rotary shaft, which is equipped with a sample-and-hold circuit adapted to read, for each constant sampling periodic interval, an off-set output signal measured by said circuit for outputting the same and a low-level output selector selects either one of the measured off-set output signal and an off-set output signal outputted from the sample-and-hold circuit, namely, the off-set output signal with a low level.

The above and other objects, features and advantages of the present invention will become apparent from the detailed description according to the following embodiments and the appended claims, taken in conjunction with the accompanying drawings.

DETAILED DESCRIPTION OF THE PREFERRED EMBODIMENTS

Figure 1:
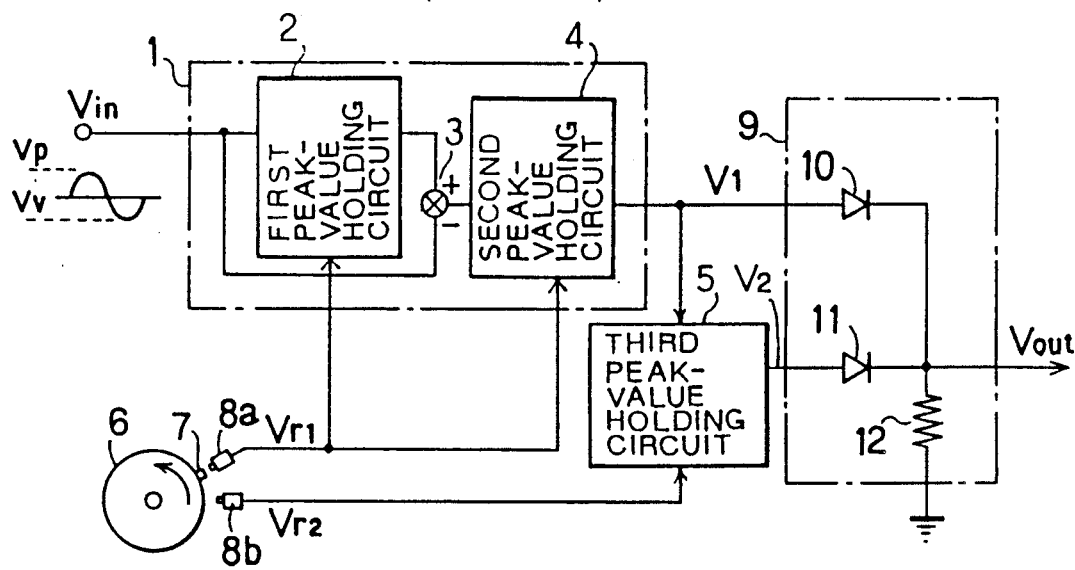
FIG. 1 is a block diagram showing one example of a conventional off-set measuring circuit.
Figure 2:
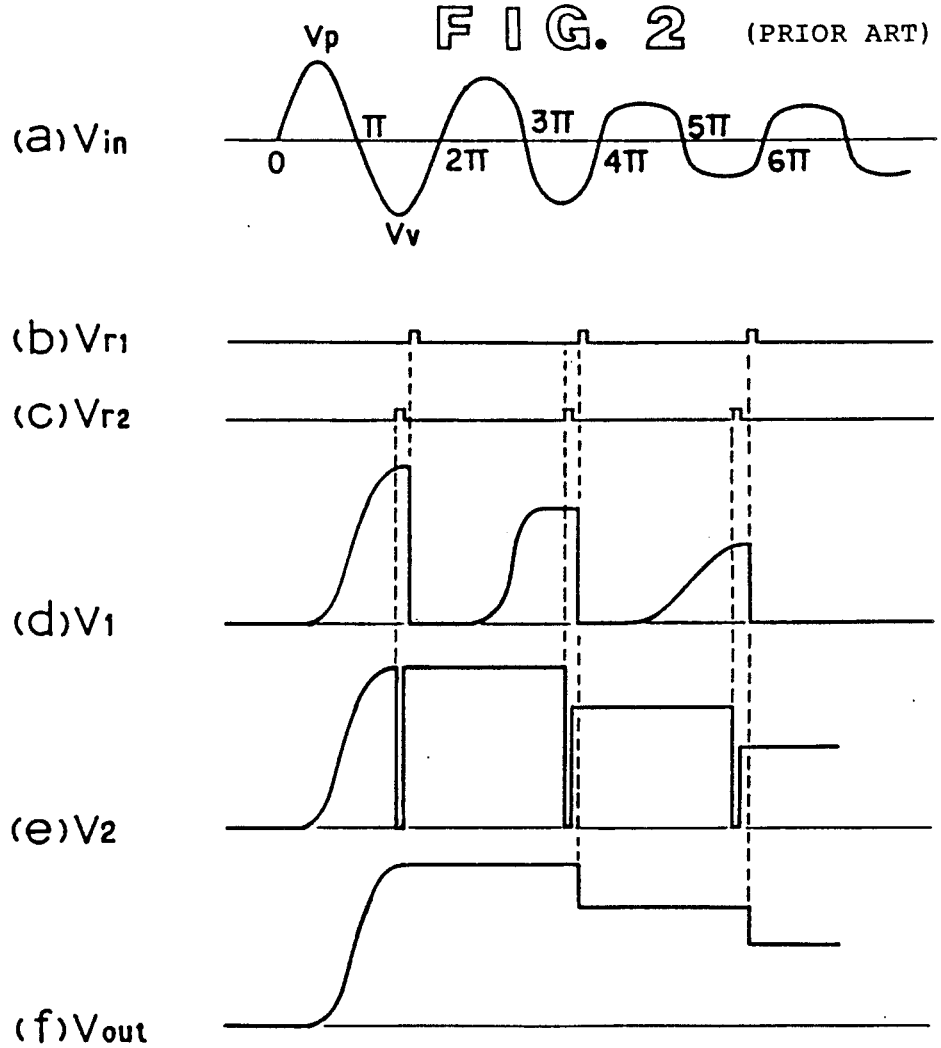
FIG. 2 is a timing chart for describing the operation of the off-set measuring circuit of FIG. 1.
Figure 3:
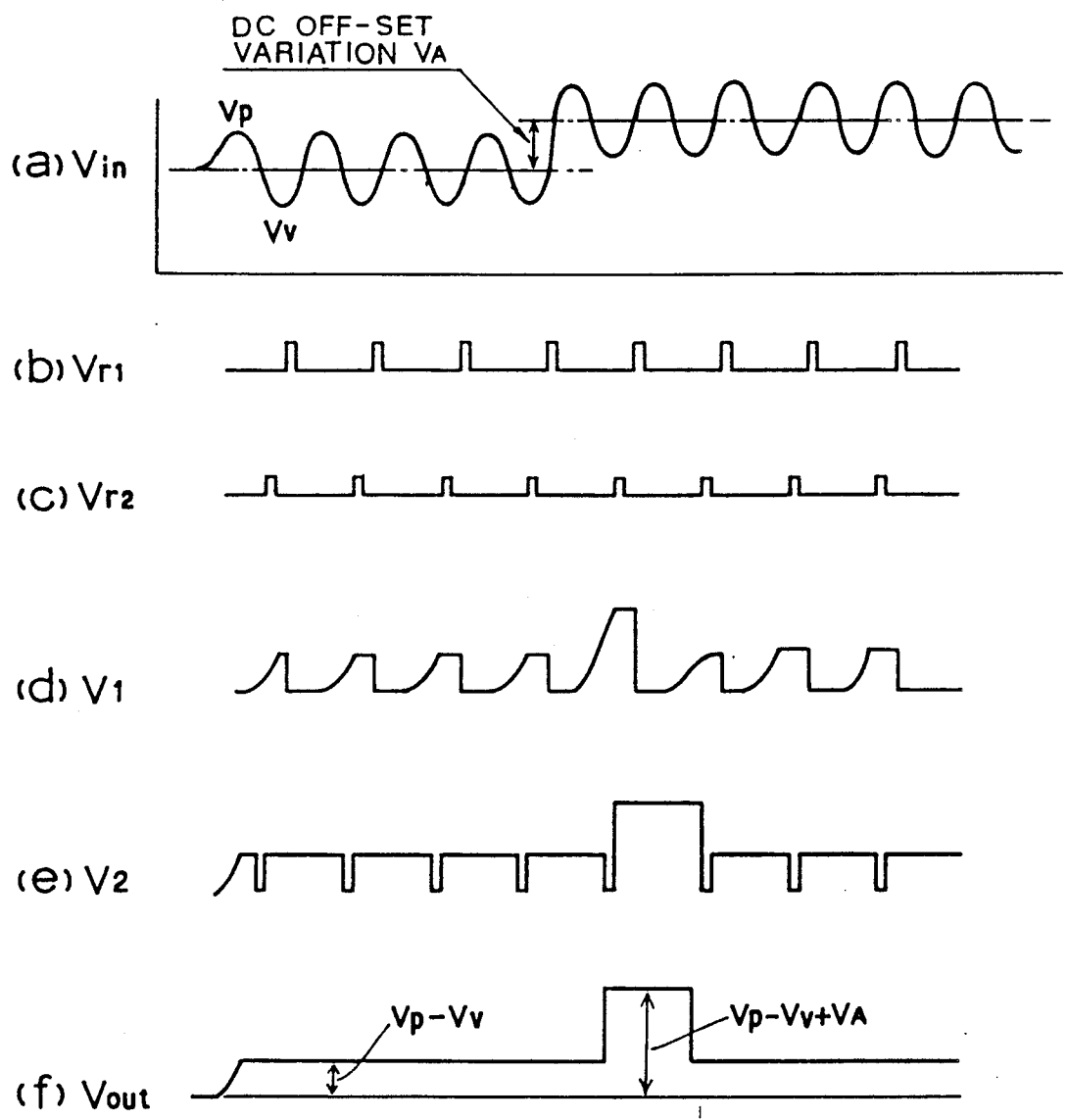
FIG. 3 is a timing chart for illustrating the operation of the conventional off-set measuring circuit where off-set variations have been produced.
Figure 4:
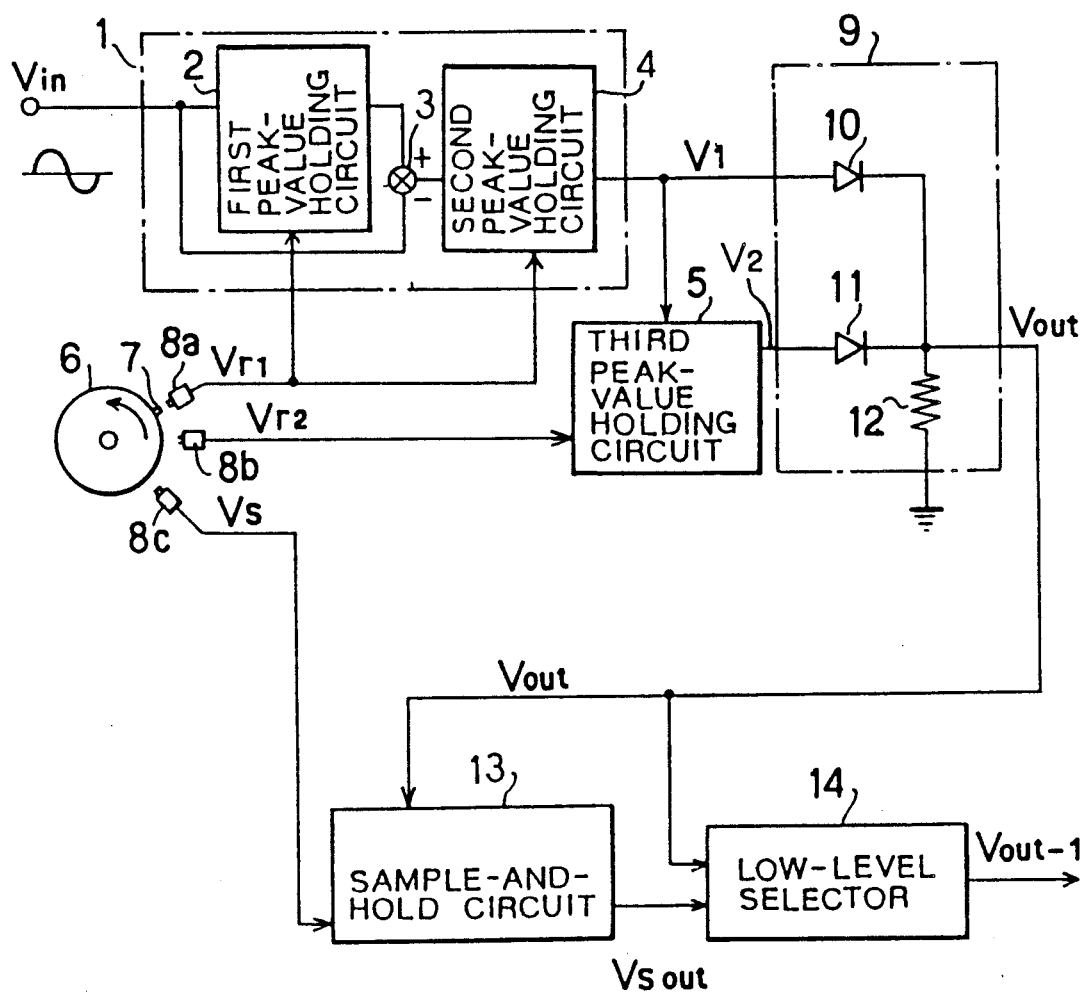
FIG. 4 is a block diagram showing the construction of a circuit for measuring off-sets of a rotary shaft according to one embodiment of this invention.
Figure 5:
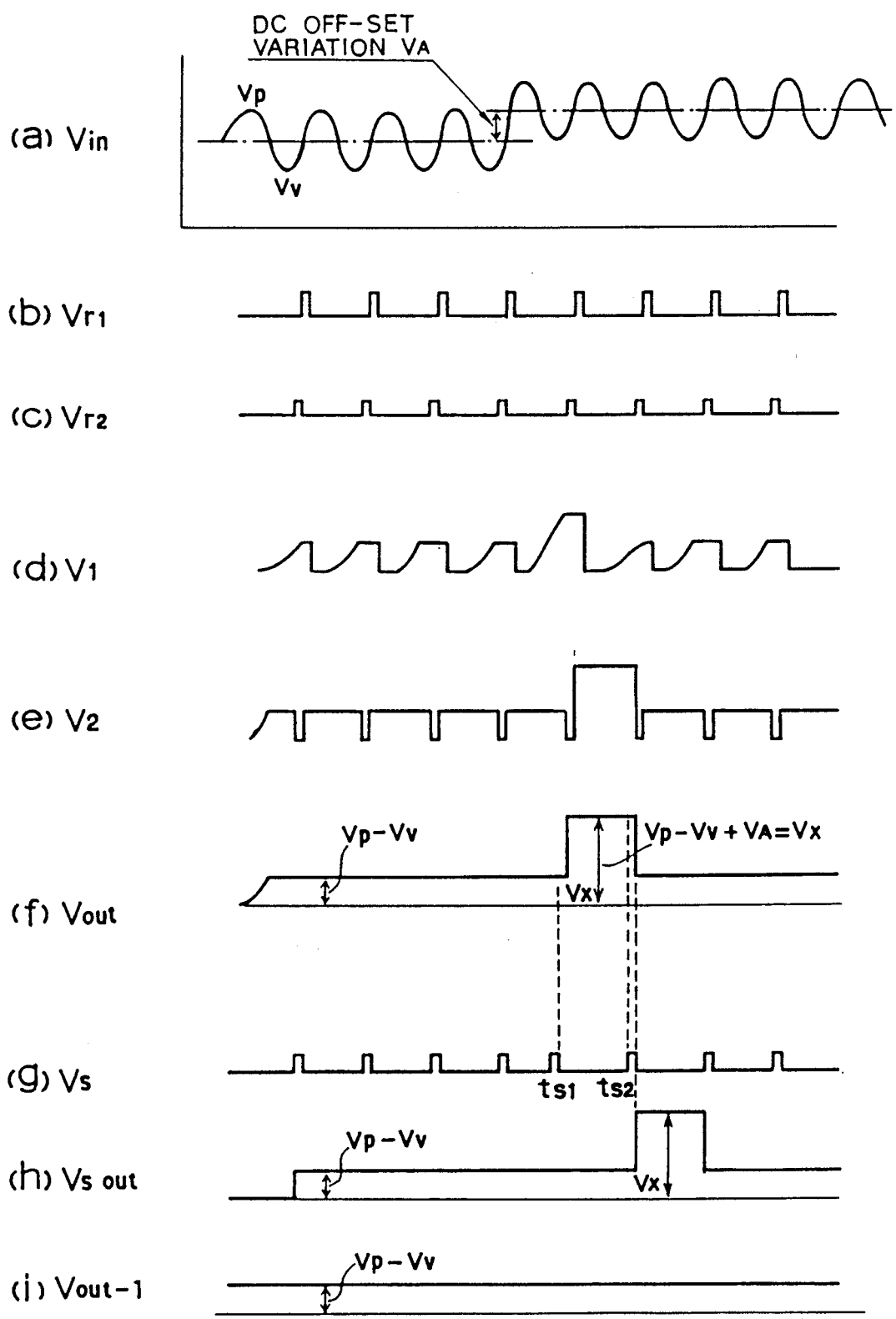
FIG. 5 is a timing chart for describing the operation of the off-set measuring circuit of FIG. 4 where DC off-set variations have been produced in an off-set input signal.

One embodiment of this invention will hereinafter be described with reference to the accompanying drawings. FIG. 4 is a block diagram showing an overall construction of a circuit for measuring off-sets of a rotary shaft according to the present embodiment. FIG. 5 is a timing chart for describing the operation of the circuit according to the present embodiment. In each drawing, the same reference numerals as those in FIGS. 1 and 2 indicate the same elements of structure or the elements of structure substantially equal to those in the embodiment and the detailed description of such elements will therefore be omitted. Referring now to FIG. 4, designated at numeral $8_c$ is a sampling pulse generator for outputting a train of sample-and-hold signal pulses $V_s$ for each detection of a projection projected from the rotary shaft 6. Numeral 13 indicates a sample-and-hold circuit for reading an off-set output signal $V_{out}$ outputted from a selector 9 each time the sample-and-hold signal pulses $V_s$ are inputted, to output the thus-read signal therefrom. Designated at numeral 14 is a low-level output selector operative to compare the off-set output signal $V_{out}$ outputted from the selector 9 with an off-set output signal $V_{sout}$ outputted from the sample-and-hold circuit 13 at a sampling periodic interval so as to select either one of both signals, namely, the low-level off-set output signal $V_{out-1'}$, thereby to output the same.

The operation of the off-set measuring circuit according to the present embodiment based on the above-described construction will next be described with reference to the timing chart shown in FIG. 5. Let's now assume that the distance between a sensor for detecting off-sets and a rotary shaft varies stepwise due to thermal expansion of a turbine upon measurement of the off-sets of the rotary shaft for use in the turbine generator. In this case, the change in the distance is shown in FIG. 5(a) as the DC off-set variation in each off-set input signal $V_{in}$ and hence a DC level in the off-set input signal $V_{in}$ constantly varies stepwise. The off-set input signal $V_{in}$, which has varied stepwise in the above-described manner, is held as the peak value of each input signal $V_{in}$ by second and third peak-value holding circuits 4 and 5 at the time of change in each input signal [see FIGS. 5(d) and 5(e)]. Thereafter, each of the DC off-set variations $V_A$ is superposed on an ordinary high-level signal ($V_p-V_v$) in the off-set output signal $V_{out}$. The off-set output signal $V_{out}$ is read, based on sampling pulses outputted from the sampling pulse generator $8c$, to the sample-and-hold circuit 13 over a period from time $t_{s1}$ to time $t_{s2}$, so that the thus-read signal is inputted to the low-level selector as the off-set output signal $V_{sout}$. The off-set output signal $V_{out}$ is inputted in advance from the selector 9 to the low-level selector 14 and then subjected to a sample-and-hold operation at a time prior to the period from time $t_{s1}$ to time $t_{s2}$. A low-level portion of the off-set output signal $V_{sout}$ which has been subjected to the sample-and-hold operation is therefore outputted whenever a high-level portion of the off-set output signal $V_{out}$ is inputted. Thereafter, the off-set output signal $V_{out}$ becomes a low level such that the constant-state portion after completion of stepwise variations in each off-set signal is detected, at the time of the input of the high-level portion of the off-set output signal $V_{sout}$. Owing to selection of such a low-level portion in the same manner as above, the low-level selector 14 is always capable of selecting the off-set output signal $V_{out-1}$ with a low level in which each DC off-set component has been cancelled, for outputting the same therefrom. The present invention is not necessarily limited to the above-described embodiment. In addition, the present invention can bring about the same advantageous effects as defined above even when each of off-set measuring circuits shown in FIGS. 6 and 7 is used.

Figure 6:
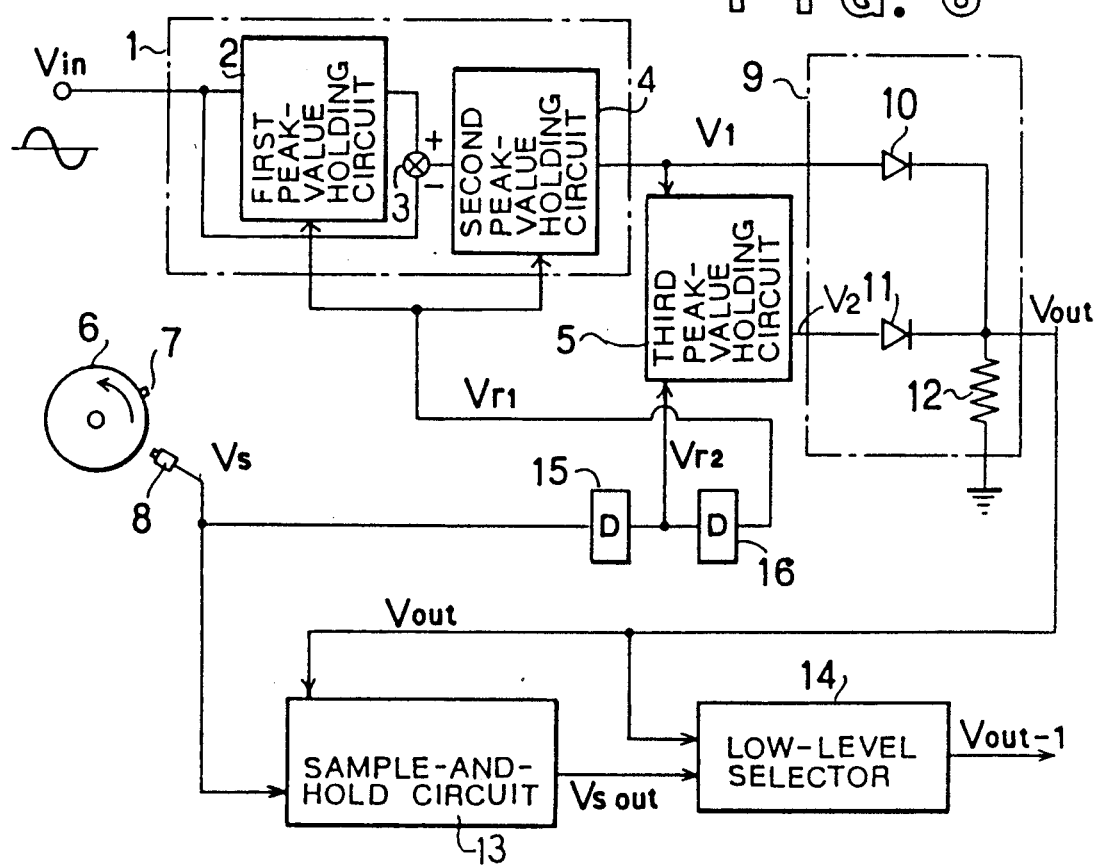
FIGS. 6 and 7 are block diagrams showing different off-set measuring circuits according to other embodiments of this invention.
Figure 7:
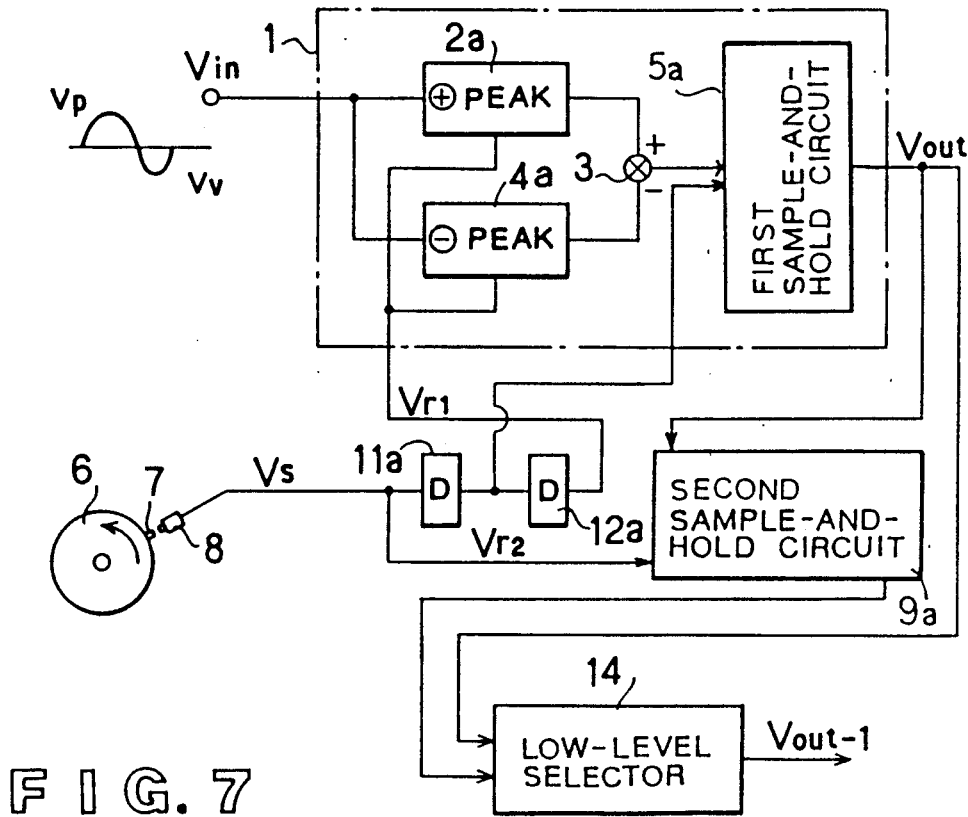

The off-set measuring circuit depicted in FIG. 6 is obtained by modifying the reset pulse generators in the circuit shown in FIG. 4. The off-set measuring circuit performs the same operation as illustrated in FIGS. 4 and 5 except that reset pulses $V_s$ from a single reset pulse generator 8 adapted to detect a projection 7 are delayed for a predetermined time alone by a delay circuit 15 to produce a train of pulses $V_{r2}$ and the pulses outputted from the delay circuit 15 are delayed for a given time alone by a delay circuit 16 to produce a train of pulses $V_{r1}$. An off-set measuring circuit according to another modification is shown in FIG. 7. Such an off-set measuring circuit is provided with a circuit $2a$ for holding the positive peak voltage of each off-set input signal $V_{in}$, a circuit $4a$ for holding the negative peak voltage thereof, a comparator 3 for performing arithmetic operations on differences between each two output signals from said circuits $2a$ and $4a$ to output the results of the operations, a first sample-and-hold circuit $5_a$, a rotary shaft 6, a projection 7, a reset pulse generator 8, a second sample-and-hold circuit $9a$, a low-level output selector 14 and delay circuits $11a$ and $12a$. The off-set measuring circuit operates in the same manner as described in FIGS. 4 and 5 exclusive of a peak-to-peak amplitude detector 1 and the reset pulse generator 8. In addition, a groove may be provided instead of the projection 7 on the rotary shaft 6 in the above-described embodiment. In this case, the use of the groove can bring about the same effects as in the above-described embodiment.

According to the present invention as has been described above, since the DC off-set variations in the off-set input signal to be measured are inputted as the external disturbance, a desired off-set measuring circuit with a good stability can be attained by using a circuit for eliminating the external disturbance, designed in such a way that such external disturbance is not taken as the off-set.

What is claimed is:

1. A circuit for measuring off-sets of a rotary shaft comprising:

a member to be detected, said member being provided on the rotary shaft;

a means for detecting said member to generate a train of reset signal pulses which are in synchronism with the rotary period of the rotary shaft;

a first peak-value holding circuit adapted to the hold peak value of each electric signal indicative of the off-set of the rotary shaft to output the same as an off-set signal and thereafter to be reset in a predetermined timing, based on said reset signal pulses;

a second peak-value holding circuit adapted to hold the off-set signal from said first peak-value holding circuit to output the same and thereafter to be reset in the same timing as that in the first peak-value holding circuit, based on the reset signal pulses;

a signal selector for selecting either one of an output from said first peak-value holding circuit and an output from said second peak-value holding circuit, namely, a high-level output so as to output the same;

a means for generating sampling pulses for each detection of said member on the rotary shaft;

a circuit for performing a sample-and-hold operation of the output from the signal selector, based on the sampling pulses; and a low-level output selector adapted to select either one of an output from the sample-and-hold circuit and an output from the signal selector, namely, the low-level output so as to output the same.

2. The circuit as claimed in claim 1 wherein the reset pulse generating means is composed of a delay circuit which is capable of delaying reset signal pulses for a predetermined time alone, said means being adapted to delay the sampling pulses for a predetermined time alone so as to produce reset signal pulses.

3. A circuit for measuring off-sets of a rotary shaft comprising:
- a member to be detected, said member being provided on the rotary shaft;
- first and second means to detect said member for generating a first train of reset signal pulses and a second train of reset signal pulses which are in synchronism with the rotary period of the rotary shaft;
- a positive peak-value holding circuit adapted to hold the positive peak-value of each electric signal indicative of the off-set of the rotary shaft to output the same and then to be reset in a predetermined timing, based on the first reset signal pulses from the first reset pulse generating means;
- a negative peak-value holding circuit adapted to hold the negative peak-value of each electric signal to output the same and then to be reset in the same timing as that in the positive peak-value holding circuit;
- a comparator for computing differences between the positive peak value of each output from the positive peak-value holding circuit and the negative peak value of each output from the negative peak-value holding circuit so as to output the results of the operation;
- a means for generating sampling pulses for each detection of said member on the rotary shaft;
- a first sample-and-hold circuit for performing a sample-and-hold operation of each output from the comparator in accordance with the second reset signal pulses outputted from the second reset signal pulse generating means and having a predetermined timing defferent from that in the first reset signal pulses so as to output the results of the operation;
- a second sample-and-hold circuit for performing a sample-and-hold operation of each output from the first sample-and-hold circuit, based on the sampling pulses so as to output the results of the operation; and
- a low-level output selector adapted to select either one of the output from the second sample-and-hold circuit and the output from the first sample-and-hold circuit, namely, the low-level output so as to output the same.

4. The circuit as claimed in claim 3 wherein the first and second reset signal pulse generating means are composed of a first delay circuit and a second delay circuit respectively both of which are operative to delay each two trains of reset signal pulses for such a predetermined time alone that they are different from each other and said means is adapted to delay the sampling pulses for each predetermined time so as to produce first and second reset signal pulses at the respective first and second delay circuits.

* * * * *